United States Patent
Maciejewski et al.

(10) Patent No.: US 9,606,202 B2
(45) Date of Patent: Mar. 28, 2017

(54) MAGNETIC RESONANCE APPARATUS

(71) Applicants: Bernd Maciejewski, Markt Erlbach (DE); Annette Stein, Erlangen (DE)

(72) Inventors: Bernd Maciejewski, Markt Erlbach (DE); Annette Stein, Erlangen (DE)

(73) Assignee: Siemens Aktiengesellschaft, München (DE)

(*) Notice: Subject to any disclaimer, the term of this patent is extended or adjusted under 35 U.S.C. 154(b) by 512 days.

(21) Appl. No.: 14/177,932

(22) Filed: Feb. 11, 2014

(65) Prior Publication Data
US 2014/0225616 A1    Aug. 14, 2014

(30) Foreign Application Priority Data

Feb. 11, 2013   (DE) .................. 10 2013 202 163

(51) Int. Cl.
| | | |
|---|---|---|
| *G01V 3/00* | (2006.01) | |
| *G01R 33/34* | (2006.01) | |
| *G01R 33/385* | (2006.01) | |
| *G01R 33/28* | (2006.01) | |

(52) U.S. Cl.
CPC ......... *G01R 33/34* (2013.01); *G01R 33/3854* (2013.01); *G01R 33/28* (2013.01)

(58) Field of Classification Search
USPC ....................................... 324/318
See application file for complete search history.

(56) References Cited

U.S. PATENT DOCUMENTS

| | | | |
|---|---|---|---|
| 5,443,068 A | 8/1995 | Cline et al. | |
| 6,157,276 A * | 12/2000 | Hedeen | G01R 33/3854 |
| | | | 324/318 |
| 6,252,404 B1 * | 6/2001 | Purgill | G01R 33/34007 |
| | | | 324/318 |
| 6,441,616 B1 | 8/2002 | Mansfield | |

(Continued)

FOREIGN PATENT DOCUMENTS

| | | |
|---|---|---|
| CN | 1298487 A | 6/2001 |
| CN | 1791805 A | 6/2006 |

(Continued)

OTHER PUBLICATIONS

German Office Action dated Jul. 12, 2013 in corresponding German Patent Application No. DE 10 2013 202 163.1 with English translation.

(Continued)

*Primary Examiner* — Rodney Fuller
(74) *Attorney, Agent, or Firm* — Lempia Summerfield Katz LLC (57) ABSTRACT

A magnetic resonance apparatus includes a magnet unit that contains a high-frequency antenna unit, and a housing casing unit enclosing the magnet unit. The housing casing unit includes a side casing unit, a front casing unit, and a rear casing unit. The side casing unit, the front casing unit, and/or the rear casing unit includes at least one casing part. At least one boundary region of the housing casing unit is disposed between the different casing parts. The housing casing unit includes at least one membrane unit that contains a barrier for the propagation and/or transmission of sound waves and that covers at least one boundary region between two casing parts.

22 Claims, 3 Drawing Sheets

(56) References Cited

U.S. PATENT DOCUMENTS

| | | | | |
|---|---|---|---|---|
| 6,469,510 | B2 * | 10/2002 | Drobnitzky | G01R 33/3806 324/318 |
| 6,556,012 | B2 * | 4/2003 | Yamashita | G01R 33/3854 324/307 |
| 6,628,117 | B2 * | 9/2003 | Ham | G01R 33/3854 324/318 |
| 6,831,461 | B2 * | 12/2004 | Arz | G01R 33/3854 324/318 |
| 7,053,744 | B2 * | 5/2006 | Arz | G01R 33/3854 324/318 |
| 2006/0273793 | A1 | 12/2006 | Roozen et al. | |
| 2009/0043189 | A1 | 2/2009 | Ladebeck et al. | |
| 2009/0260917 | A1 * | 10/2009 | Maciejewski | F16F 15/02 181/207 |
| 2011/0291656 | A1 | 12/2011 | Maciejewski | |
| 2012/0313643 | A1 * | 12/2012 | Edelstein | G01R 33/3854 324/318 |
| 2013/0043870 | A1 * | 2/2013 | de Lima | G01R 33/34007 324/318 |

FOREIGN PATENT DOCUMENTS

| | | |
|---|---|---|
| CN | 101796425 A | 8/2010 |
| DE | 19838390 A1 | 3/2000 |
| DE | 102010029472 | 12/2011 |
| EP | 1552787 A1 | 7/2005 |
| JP | 2009039530 A | 2/2009 |
| KR | 20120016345 A | 2/2012 |
| WO | 2009031092 | 3/2009 |

OTHER PUBLICATIONS

German Office action for related German Application No. 10 2013 202 163.1, dated Jul. 12, 2013, with English Translation.

Korean Office action for related Korean Application No. 10-2014-0013698, dated Sep. 24, 2015, with English Translation.

* cited by examiner

MAGNETIC RESONANCE APPARATUS

RELATED APPLICATIONS

This application claims the benefit of German Patent Application No. DE 102013202163.1, filed Feb. 11, 2013, the entire contents of which are hereby incorporated herein by reference.

TECHNICAL FIELD

The present teachings relate generally to a magnetic resonance apparatus that includes a magnet unit containing a high-frequency antenna unit, and a housing casing unit that encloses the magnet unit and includes a side casing unit, a front casing unit and a rear casing unit. The side casing unit, the front casing unit, and/or the rear casing unit each includes at least one casing part. At least one boundary region of the housing casing unit is disposed between the different casing parts.

BACKGROUND

When magnetic resonance apparatuses operate, an interaction between a gradient coil unit and a main magnet of a magnet unit may result in loud noises (e.g., knocking). Noise and/or sound waves escape and/or are emitted in a region enclosed by the magnetic resonance apparatus (e.g., the magnet unit) via end faces (e.g., a rear face and/or a front face) of the magnet unit to a housing casing of the magnetic resonance apparatus.

The housing casing together with the high-frequency antenna unit may reduce noise or damp the sound waves emitted from the magnet unit. The high-frequency antenna unit may shield a patient-receiving region of the magnetic resonance apparatus at least partially from the sound waves emitted from the magnet unit. The housing casing has a number of casing parts that adjoin one another at boundary regions. These boundary regions between the individual casing parts and/or in boundary regions between a casing part and the high-frequency antenna unit may have acoustic bridges that favor an emission of sound waves and/or an escape of noise. In addition, plastic casing parts are subject to manufacturing and/or assembly tolerances (e.g., due to the size of the casing parts) that favor the presence of acoustic bridges.

Additional factors (e.g., design, accessibility for servicing, manufacturing tolerances, cable inputs, supports for the high-frequency antenna unit, cooling circuit inputs, and/or the like) may be taken into account for reducing and/or sealing acoustic bridges and/or sound bridges of the housing casing (e.g., with respect to the propagation of air-borne sound waves and/or structure-borne sound waves in the front region and/or in the rear region). However, consideration of additional factors makes it more difficult to reduce and/or seal the acoustic bridges and/or sound bridges of the housing casing on the front face and/or on the rear face of the magnetic resonance apparatus.

In order to reduce and/or seal the acoustic bridges and/or sound bridges of the boundary regions between the tapering insertion units and the high-frequency antenna unit and/or the disk-shaped casing parts, the individual casing parts and/or units of the housing casing may be provided in an overlapping manner. Alternatively, sealing elements made, for example, from PE foam, silicone, or the like may be used to at least partially seal the acoustic bridges and/or sound bridges. However, these solutions have a disadvantage in that a harder seal is more impermeable to air-borne sound and transmits structure-borne sound to a greater degree. The form of the tapering insertion unit results in a trumpet-like transmission of structure-borne sound to the tapering insertion unit, thereby causing undesirable sound exposure for the patient.

SUMMARY AND DESCRIPTION

The scope of the present invention is defined solely by the appended claims, and is not affected to any degree by the statements within this summary.

The present embodiments may obviate one or more of the drawbacks or limitations in the related art. For example, in some embodiments, a housing casing unit is provided that reduces and/or prevents acoustic bridges and/or sound bridges between the individual casing parts.

In some embodiments, a magnetic resonance apparatus includes a magnet unit containing a high-frequency antenna unit, and a housing casing enclosing the magnet unit. The housing casing includes a side casing unit, a front casing unit, and a rear casing unit. The side casing unit and/or the front casing unit and/or the rear casing unit include at least one casing part. At least one boundary region of the housing casing unit is disposed between the different casing parts.

The housing casing unit has at least one membrane unit that includes a barrier for the propagation and/or transmission of sound waves and that covers at least one boundary region between two casing parts. In some embodiments, a membrane unit includes a separating layer that may be at least partially impermeable to the propagation of sound waves (e.g., air-borne sound waves) and may be configured to be completely impermeable to the propagation of air-borne sound waves. The membrane unit may form a barrier for the propagation of air-borne sound waves. The membrane unit may be formed from a magnetic resonance-compatible sound-damping material. For example, the membrane unit may be formed from a PVC (polyvinylchloride) material that may also be provided with reinforcing fibers, a silicone material (e.g., a silicone mat), a PU (polyurethane) film, a PU integral foam, an elastomer, and/or the like.

In some embodiments, acoustic bridges and/or sound bridges within the housing casing unit may be reduced. In some embodiments, acoustic bridges and/or sound bridges may be reduced and/or closed at boundary regions between two adjoining components and/or structural units of the housing casing unit, thereby reducing sound emission and/or the emission of sound waves into a region enclosing the magnet unit and the housing casing unit. During operation of the magnetic resonance apparatus, a reduction in a sound pressure level of 5 dB and, in some embodiments, 10 dB may be achieved after the barrier or membrane unit along a propagation direction of the sound waves (e.g., air-borne sound waves). Thus, a magnetic resonance apparatus with less noise and/or sound may be provided, thereby reducing sound exposure for the patient during a magnetic resonance examination. In addition, the membrane unit may protect the magnet unit and/or additional components (e.g., electronic components) from fluids (e.g., body fluids from a patient and/or cleaning fluids).

The casing parts may be formed by an annular casing part and/or tapering insertion unit elements and/or disk-shaped casing parts. The boundary regions include a region wherein at least two of the casing parts adjoin.

The side casing unit, the front casing unit, and/or the rear casing unit include the at least one membrane unit. The at least one membrane unit is disposed on boundary regions between the side casing unit, the front casing unit, and/or the rear casing unit. A reliable impermeability of the housing casing to the propagation of sound waves may be achieved. The membrane unit may be disposed within the housing casing unit in addition to existing casing units.

At least one membrane unit is disposed along a transmission path and/or a propagation path of the sound waves emitted from the magnet unit between the magnet unit and at least one casing part. The membrane unit may be disposed in such a way that the membrane unit is well protected from unwanted damage (e.g., when a patient support apparatus is introduced into a patient-receiving region of the magnetic resonance apparatus enclosed in a cylindrical manner by the high-frequency antenna unit). In some embodiments, the membrane unit may be provided with an air-borne sound wave-damping function, thereby providing a low-cost membrane unit. The at least one membrane unit may also form a double-shell casing together with the at least one casing part. The at least one casing part may be optimized for impermeability of structure-borne sound waves. The at least one membrane unit and the at least one casing part may be configured separately from one another.

The front casing unit and/or the rear casing unit may have a tapering casing insertion unit. A first boundary region is disposed between a boundary surface of the tapering casing insertion unit of the front casing unit and/or the rear casing unit facing the high-frequency antenna unit, and a boundary surface of the high-frequency antenna unit facing the tapering casing insertion unit of the front casing unit and/or the rear casing unit. The at least one membrane unit may be disposed along a transmission path and/or propagation path of the sound waves emitted from the magnet unit in front of the first boundary region. Acoustic bridges and/or sound bridges on the first boundary region between the high-frequency antenna unit and the tapering casing insertion unit of the front casing unit and/or the rear casing unit may be reduced and/or closed with respect to the unwanted propagation of sound waves. The first boundary region between the front casing unit and/or the rear casing unit and the high-frequency antenna unit may also be configured to have a gap between the adjoining boundary surfaces (e.g., due to manufacturing and/or assembly tolerances and/or due to avoiding transmission of structure-borne sound waves). This first boundary region is a region of major sound emission in magnetic resonance apparatuses.

Alternatively or additionally, the front casing unit and/or the rear casing unit may have a tapering casing insertion unit and at least one additional casing part. A second boundary region is disposed between the boundary surface of the tapering casing insertion unit facing the additional casing part and a surface of the additional casing part facing the tapering casing insertion unit on the front casing unit and/or the rear casing unit. The at least one membrane unit is disposed along a transmission path and/or propagation path of the sound waves emitted from the magnet unit in front of the second boundary region. Acoustic bridges and/or sound bridges on the second boundary region between the casing part and the tapering casing insertion unit on the front casing unit and/or the rear casing unit may be reduced and/or blocked with respect to the unwanted propagation of sound waves. The second boundary region between the tapering casing insertion unit and the casing part of the front casing unit and/or the rear casing unit may also be configured with a gap between the adjoining boundary surfaces (e.g., due to manufacturing and/or assembly tolerances and/or due to avoiding transmission of structure-borne sound waves). This first boundary region is a region of major sound emission in magnetic resonance apparatuses.

The additional casing part may adjoin the tapering casing insertion unit at a radially outer edge region of the tapering casing insertion unit. The tapering casing insertion unit may adjoin the high-frequency antenna unit at an edge region on a face facing away from the annular casing part. The additional casing part may also include a design element of the housing casing unit. The additional casing part may be annular.

A compact tapering casing insertion unit with few parts may be achieved if the at least one membrane unit of the front casing unit and/or the rear casing unit is disposed along a transmission path and/or a propagation path of sound waves in front of the first boundary region and the second boundary region.

In some embodiments, the membrane unit at least partially has the form of a truncated cone. The truncated cone configuration allows the membrane unit to cover at least one boundary region completely and without gaps in a circumferential direction. Differing distances between the boundary surfaces of a boundary region along the circumferential direction (e.g., due to manufacturing tolerances and/or assembly tolerances) may be shielded by the membrane unit for air-borne sound waves. The truncated cone form corresponds to a hose-type configuration of the membrane unit with different opening surfaces on the end regions.

In some embodiments, the housing casing unit has at least one fastening unit. The at least one membrane unit is disposed on the high-frequency antenna unit and/or on at least one casing part by the at least one fastening unit. Direct and gap-free shielding of the different boundary regions between the individual casing parts and/or at least one casing part and the high-frequency antenna unit may be achieved by the membrane unit. The membrane unit may be releasably disposed on the high-frequency antenna unit on the casing part (e.g., on a tapering casing insertion unit and/or an annular casing part of the front casing unit and/or of the rear casing unit).

A space-saving arrangement of the fastening unit may be achieved if the fastening unit has at least one fastening element that is disposed along a radial direction on an outer face of the high-frequency antenna unit to fasten the at least one membrane unit to the high-frequency antenna unit. The fastening element may be disposed on a region of the high-frequency antenna unit facing the tapering casing insertion unit.

In some embodiments, the at least one fastening unit has at least one fastening element that is disposed on an outer face of the casing part of the front casing unit and/or the rear casing unit facing away from the magnet unit. This configuration allows a user (e.g., a fitter) to access and/or reach the fastening element to fasten the membrane unit to the casing part of the front casing unit and/or of the rear casing unit.

Alternatively, the fastening element may be disposed on a face of the casing part of the front casing unit and/or the rear casing unit facing the magnet unit. The fastening element may be actuated, for example, from a face of the casing part of the front casing unit and/or the rear casing unit facing away from the magnet unit. The at least one fastening element may thus be protected from unwanted damage and a space-saving arrangement and a compact housing casing may be achieved.

In some embodiments, the fastening unit has at least one fastening element that is formed by a form-fit element. A structurally simple and releasable fastening and/or connection of the membrane unit to the high-frequency antenna unit and/or a casing part (e.g., of the front casing unit and/or the rear casing unit) may be achieved. The form-fit element may be formed by a tensioning element and/or a clamping element. Arrangement on and/or fastening to an additional part (e.g., to the high-frequency antenna unit and/or the casing part) may be achieved such that there are no acoustic bridges, sound wave bridges, and/or sound wave permeability (e.g., of air-borne sound waves).

Alternatively or additionally, the fastening element formed by a form-fit element may also be formed by a hook element, a tension spring, and/or other form-fit elements. In some embodiments, the at least one fastening element is not a form-fit element. For example, in some embodiments, the fastening element is a force-fit element with an elastic configuration of the membrane unit tensioned at an edge region by the high-frequency antenna unit and/or the casing part. In some embodiments, the fastening element is a material-fit element (e.g., a bonding element). Both force-fit and material-fit may be provided.

DETAILED DESCRIPTION

Figure 1:
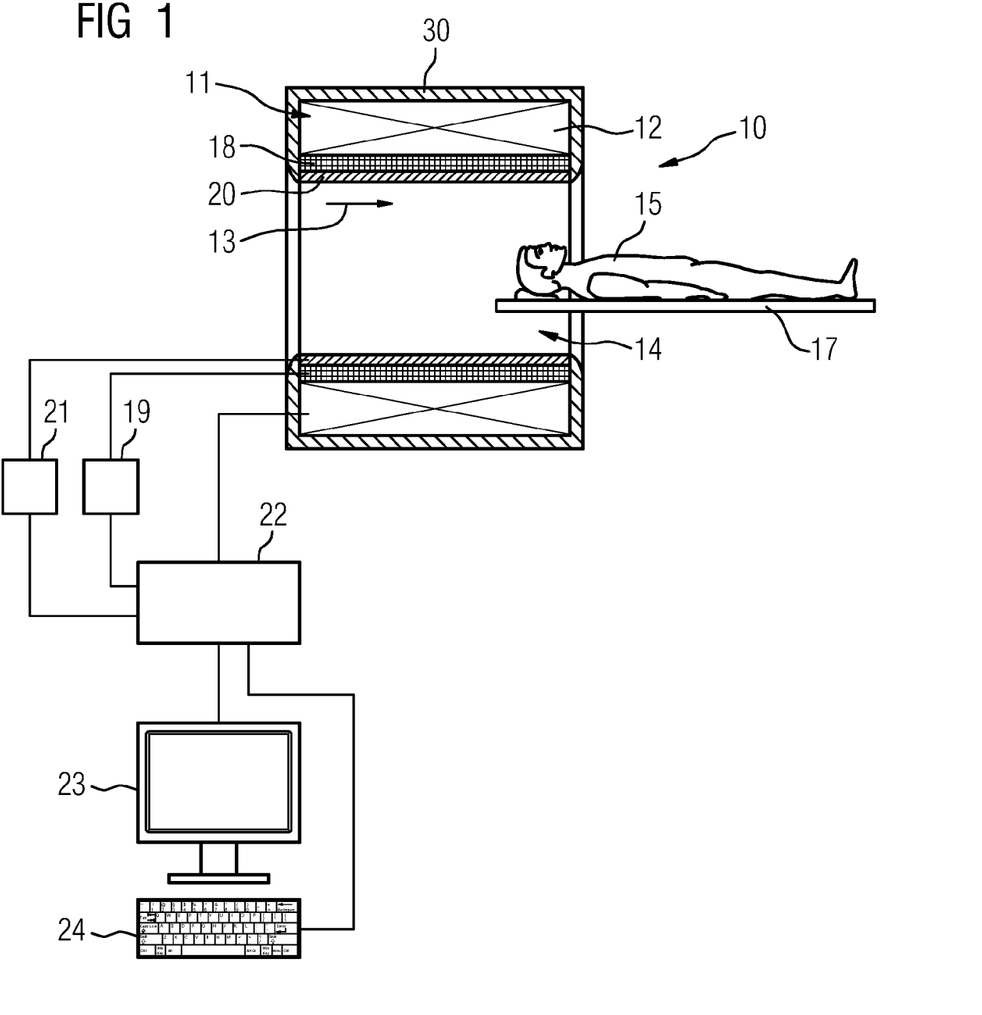
FIG. 1 shows a schematic diagram of an exemplary magnetic resonance apparatus.

FIG. 1 shows a schematic diagram of a magnetic resonance apparatus 10. The magnetic resonance apparatus 10 includes a magnet unit 11 with a main magnet 12 configured for generating a powerful and constant main magnetic field 13. The magnetic resonance apparatus 10 has a cylindrical patient-receiving region 14 configured for receiving a patient 15. The patient-receiving region 14 is enclosed cylindrically in a circumferential direction by a housing casing unit 30 of the magnetic resonance apparatus 10 enclosing the magnet unit 11. The patient 15 may be moved into the patient-receiving region 14 by a patient support apparatus 17 of the magnetic resonance apparatus 10. The patient support apparatus 17 is movably disposed within the patient-receiving region 14.

The magnet unit 11 includes a gradient coil unit 18 configured for generating magnetic field gradients that is used for spatial encoding during imaging. The gradient coil unit 18 is controlled by a gradient control unit 19. The magnet unit 11 further includes a high-frequency antenna unit 20 and a high-frequency antenna control unit 21 configured for exciting polarization in the main magnetic field 13 generated by the main magnet 12. The high-frequency antenna unit 20 is controlled by the high-frequency antenna control unit 21 and radiates high-frequency magnetic resonance sequences into an examination chamber formed by the patient-receiving region 14.

To control the main magnet 12 of the gradient control unit 19 and to control the high-frequency antenna control unit 21, the magnetic resonance apparatus 10 includes a control unit 22 formed by a computation unit. The control unit 22 controls the magnetic resonance apparatus 10 centrally (e.g., the performance of a predetermined gradient echo sequence for imaging purposes). The control unit 22 also includes an evaluation unit configured for evaluating image data. Control information, such as imaging parameters and reconstructed magnetic resonance images, may be displayed to an operator on a display unit 23 (e.g., at least one monitor of the magnetic resonance apparatus 10). The magnetic resonance apparatus 10 also includes an input unit 24. Information and/or parameters may be input through the input unit 24 by an operator during a measurement process. The magnetic resonance apparatus 10 may include additional components.

Figure 2:
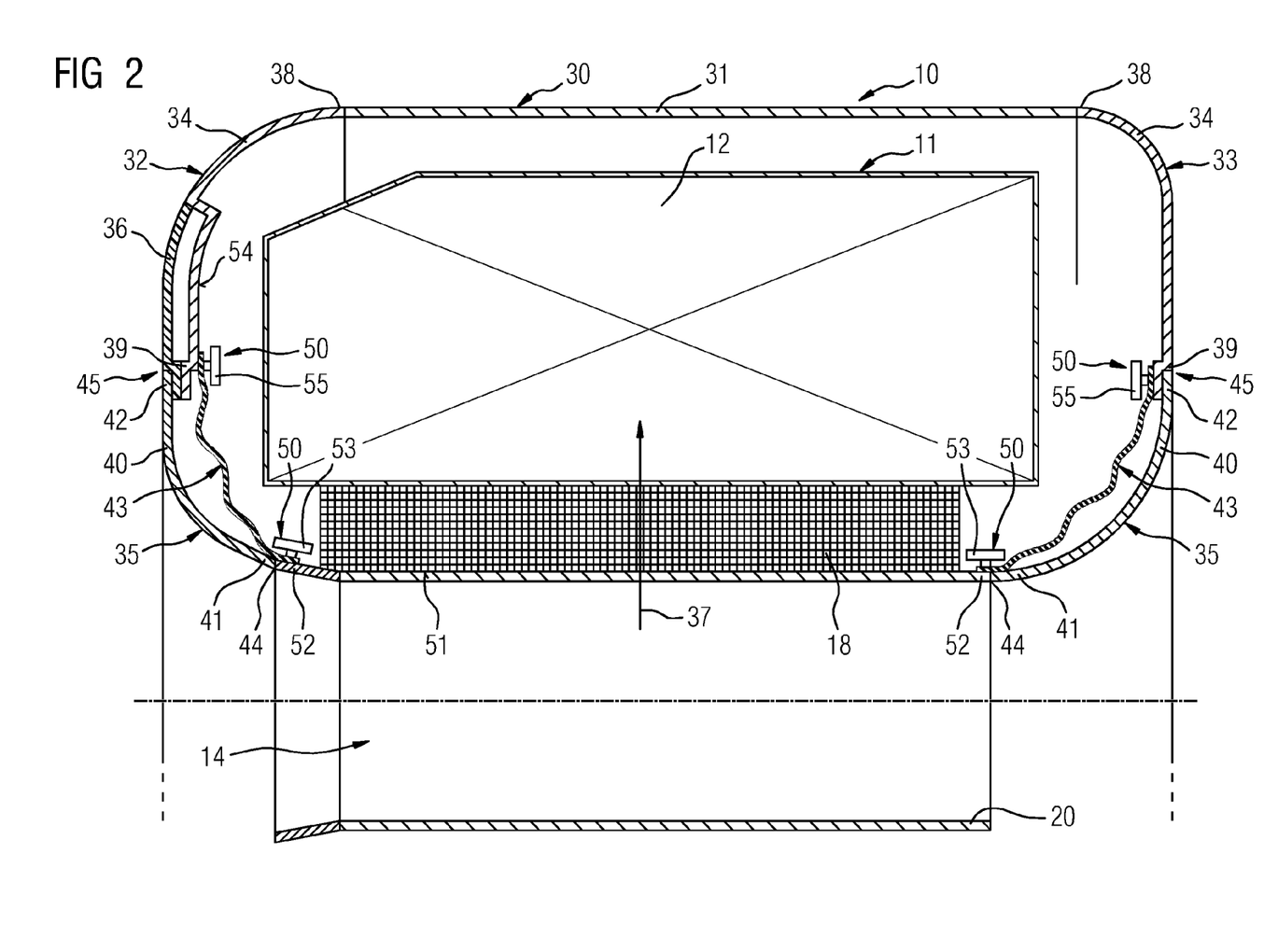
FIG. 2 shows a sectional diagram of a subregion of the exemplary magnetic resonance apparatus having a front casing unit and/or a rear casing unit.
Figure 3:
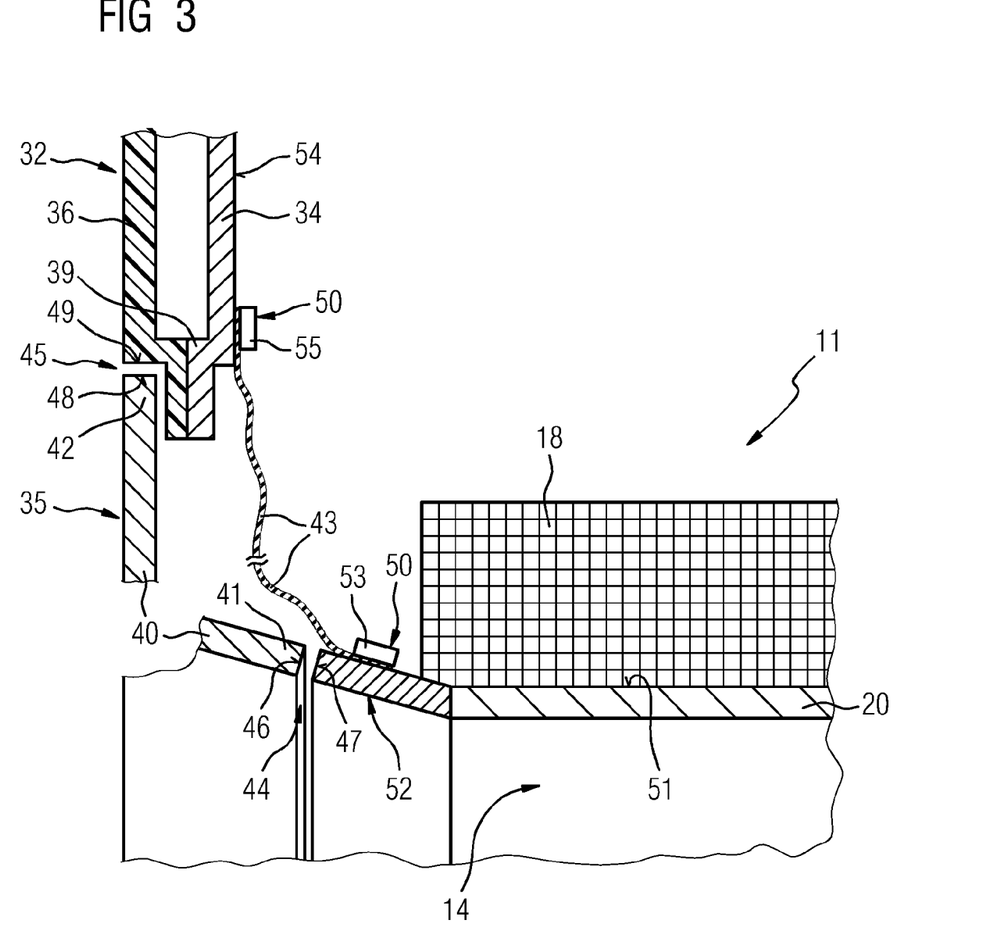
FIG. 3 shows a detailed sectional view of boundary regions of an exemplary housing casing unit.

The housing casing unit 30 is shown in more detail in FIGS. 2 and 3 and includes a side casing unit 31, a front casing unit 32, and a rear casing unit 33. The front casing unit 32 and the rear casing unit 33 each includes a plurality of casing parts 34, 36, and 40. The casing parts 34 are configured as annular. The casing part 36 of the front casing unit 33 is formed by a circular disk-shaped design element and/or insert element, a transverse extension of the design elements, and/or insert elements that are smaller than a transverse extension of the annular casing part 34. The annular casing parts 34 also adjoin the side casing unit 31 at an outer edge region 38 in a radial direction 37.

Each of the front casing unit 32 and the rear casing unit 33 also includes a tapering casing insertion unit 35. The tapering casing units 35 include the casing part 40 that is formed by a tapering casing element. The annular casing parts 34 adjoin the tapering casing elements of the tapering casing insertion units 35 at an inner edge region 39 in a radial direction 37. The tapering casing elements adjoin the high-frequency antenna unit 20 at a first edge region 41 and the annular casing part 34 of the rear casing unit 33 at a second edge region 42, or both the casing parts 34 and the casing parts 36 at the front casing unit 32.

Each of the front casing unit 31 and the rear casing unit 33 also includes a membrane unit 43 configured for shielding the first boundary region 44 and the second boundary region 45 from sound waves (e.g., air-borne sound waves) within the housing casing unit 30. FIG. 3 shows a more detailed view of the first boundary region 44 and the second boundary region 45 in relation to the front casing unit 32. The first boundary region 44 within the housing casing unit 30 is disposed between a boundary surface 46 of the tapering casing element of the front casing unit 32 facing the high-frequency antenna unit 20 and a boundary surface 47 of the high-frequency antenna unit 20 facing the tapering casing element of the front casing unit 32. The second boundary region 45 within the housing casing unit 30 is disposed between the tapering casing element and the casing part 36 configured as a design element and/or an insert element. The second boundary region is disposed between a boundary surface 48 of the tapering casing element facing the casing part 36 and a boundary surface 49 of the casing part 36 facing the tapering casing element on the front casing unit 32. The first boundary region 44 and the second boundary region 45 are similarly disposed on the rear casing unit 33. The first boundary region 44 is disposed between a boundary surface 46 of the tapering casing element of the rear casing unit 33 facing the high-frequency antenna unit 20 and a boundary surface 47 of the high-frequency antenna unit 20 facing the tapering casing element of the rear casing unit 33. The second boundary region 45 is disposed between a boundary surface 48 of the tapering casing element facing the annular casing part 34 and a boundary surface 49 of the annular casing part 34 facing the tapering casing element on the rear casing unit 33.

The membrane unit 43 of the front casing unit 32 is disposed along a transmission path and/or a propagation path of the sound waves (e.g., air-borne sound waves) emitted and/or transmitted from the magnet unit 11 in front of the first boundary region 44 and the second boundary region 45 of the front casing unit 43. The first boundary region 44 and the second boundary region 45 are shielded at least partially from the air-borne sound waves. The membrane unit 43 of the rear casing unit 33 is also disposed along a transmission path and/or a propagation path of the sound waves (e.g., air-borne sound waves) emitted and/or transmitted from the magnet unit 11 in front of the first boundary region 44 and the second boundary region 45 of the rear casing unit 33. The first boundary region 44 and the second boundary region 45 are shielded at least partially from the air-borne sound waves. During operation of the magnetic resonance apparatus 10, the membrane units 43 allow a sound pressure level in a region enclosing the magnet unit 11 and the housing casing unit 30 to be reduced by 5 dB and, in some embodiments, by 10 dB in the patient-receiving region 14.

The membrane unit 43 of the front casing unit 32 and the membrane unit 43 of the rear casing unit 33 are individually configured in the form of a hose and/or a truncated cone. The first boundary region 44 and the second boundary region 45 on the front casing unit 32 or the rear casing unit 33 may be completely covered by the two membrane units 43. To dampen sound waves (e.g., air-borne sound waves), the membrane units 43 may be formed at least partially from an air-borne sound-shielding material. Representative materials include a PVC material that may be provided with reinforcing fibers, a silicone material (e.g., a silicone mat), a PU film, a PU integral foam, an elastomer, and/or the like.

The membrane unit 43 of the front casing unit 32 and the membrane unit 43 of the rear casing unit 33 are individually disposed on the housing casing along a direction of emission of sound waves on the magnet unit 11 between the tapering casing element of the tapering casing insertion unit 35 and the magnet unit 11. The membrane units 43 and the tapering casing insertion units 35 provide a double-shell structure for the housing casing unit 30 in the region of the tapering casing insertion unit 35 and the first boundary region 44 and the second boundary region 45. Efficient sound damping is achieved by the housing casing unit 35. The individual membrane units 43 are disposed on the high-frequency antenna unit 20 and the annular casing part 34 on the front casing unit 32 and the rear casing unit 22.

Each of the front casing unit 32 and the rear casing unit 33 includes a fastening unit 50 to fasten and/or dispose the membrane units 43 on the high-frequency antenna unit 20 and the annular casing parts 34 of the front casing unit 32 and the rear casing unit 33. To fasten and/or dispose the membrane units 43 on the high-frequency antenna unit 20, each of the fastening units 50 of the front casing unit 32 and the rear casing unit 33 includes a fastening element 53 disposed along the radial direction 37 on an outer face 51 of the high-frequency antenna unit 20. The two fastening elements 53 are disposed on an edge region 52 of the cylindrical high-frequency antenna unit 20. The two fastening elements 53 are disposed along a longitudinal extension of the high-frequency antenna unit 20 on opposing edge regions 52.

In some embodiments, the fastening elements 53 for fastening and/or disposing the membrane units 43 on the high-frequency antenna unit 20 include form-fit elements that are formed by clamping elements and/or tensioning elements. For example, the clamping elements and/or tensioning elements for fastening and/or disposing the membrane units 43 on the high-frequency antenna unit 20 may be formed by pipe clamp-type elements. The pipe clamp-type elements may have an annular clamping surface and/or tensioning surface that clamps and/or tensions the membrane unit 43 (e.g., an edge region of the membrane unit 43) of the front casing unit 32 and/or the rear casing unit 33 to the outer face 51 of the edge region 52 of the high-frequency antenna unit 20 facing the front casing unit 32 and/or the rear casing unit. This configuration may be used with a film-type embodiment of the membrane units 43. If at least one of the membrane units 43 includes a PU integral foam, the form-fit elements may also have hook elements for fastening and/or disposing the membrane unit 43 on the high-frequency antenna unit 20. A PU integral foam seals acoustically due to its thickness even with a hook fastening.

Further embodiments of the clamping elements and/or tensioning elements for fastening and/or disposing the membrane units 43 on the edge regions 52 of the high-frequency antenna unit 20 may also be used. In some embodiments, a clip element may be provided. Alternatively or additionally, the fastening units 50 may include additional fastening elements 53 configured for fastening and/or disposing the membrane units 43 on the edge regions 52 of the high-frequency antenna unit 20. These additional fastening elements 53 may include a force-fit element and/or a material-fit element (e.g., a bonding layer) or the like. In some embodiments, an elastic membrane unit 43 may be tensioned by the edge region 52 of the high-frequency antenna unit 20 to fasten the membrane unit 43 to the high-frequency antenna unit 20.

The fastening units 50 have additional fastening elements 55 for fastening and/or disposing the membrane units 43 on the annular casing parts 34 of the front casing unit 32 and the rear casing unit 33. In some embodiments, the fastening elements 55 for fastening and/or disposing the membrane units 43 on the annular casing parts 34 of the front casing unit 32 and the rear casing unit 33 also include form-fit elements. The form-fit elements may include clamping elements and/or tensioning elements. The clamping elements and/or tensioning elements individually or together may include an annular clamping surface and/or a tensioning surface that clamps and/or tensions the membrane units 43 (e.g., an edge region of the membrane units 43) to the annular casing parts 34 of the front casing unit 32 and/or the rear casing unit 33. The clamping elements and/or tensioning elements may include a pipe clamp-type element, an eccentric tensioning element, and/or additional clamping elements and/or tensioning elements. Additional embodiments of the clamping elements and/or tensioning elements for fastening and/or disposing the membrane units 43 on the annular casing parts 34 of the front casing unit 32 and/or the rear casing unit 33 are also possible (e.g., a clip element). Alternatively or additionally, the fastening units 50 may include additional fastening elements 55 configured for fastening and/or disposing the membrane units 43 on the annular casing parts 34 of the front casing unit 32 and/or the rear casing unit 33. The additional fastening elements 55 may include a force-fit element, a material-fit element (e.g., a bonding layer), and/or the like.

As shown in FIG. 2, the fastening elements 55 are disposed on the annular casing parts 34 on the edge region 39 facing the tapering casing insertion unit 35. In some embodiments, the individual fastening elements 55 may be disposed on a face 54 of the annular casing parts 34 facing the magnet unit 11. The individual fastening elements 34 may be actuated by a user from the outer face of the annular casing parts 34, and the annular casing parts 34 may have actuation elements (not shown in detail) for this purpose. In some embodiments, an actuation element may be pressed to unclamp a clamping element disposed on the face 54 of the annular casing parts 34 facing the magnet unit 11 to introduce and/or remove one of the membrane units 43.

Alternatively, the fastening elements 55 may be disposed on a face of the annular casing parts 34 facing the magnet unit 11. The arrangement of the fastening elements 55 within are concealed by additional units and/or parts of the housing casing unit 30 (e.g., the front casing unit 32 and/or the rear casing unit 33). In some embodiments, the fastening elements 55 and/or the membrane units 43 are not visible to a user when the housing casing 30 is in the assembled state. For example, in some embodiments, an arrangement of the fastening elements 55 in a region of the annular casing parts 34 may be concealed by the design element and/or insert element of the housing casing unit 30.

In the region of the second boundary region 45, the annular casing parts 34 have a projection projecting behind the tapering casing element. The projection is at least partially covered by the tapering casing element when the housing casing unit 30 is in the assembled state. The fastening elements 55 may also be disposed in the second boundary region 45 or on the projection of the annular casing parts 34, thereby allowing the membrane units 43 to be fastened and/or disposed therein. The fastening units 50 may be disposed on the outer face of the annular casing parts 34. The membrane units 43 may be fastened and/or disposed on the annular casing parts 34 but still concealed by an additional part (e.g., a design element, the insert element, and/or the tapering casing element). Other positions on the annular casing parts 34 may also be used for disposing the fastening elements 55 and for fastening and/or disposing the membrane units 43 on the annular casing parts 34.

FIGS. 2 and 3 show an exemplary arrangement of the membrane unit 43 within the housing casing unit 30 wherein the membrane units 43 are arranged on the front casing unit 32 and on the rear casing unit 33. In other embodiments, at least one membrane unit 43 may be arranged on boundary regions between individual casing parts of the side casing unit 31 and/or on boundary regions between the side casing unit 31 and the front casing unit 32 and/or on boundary regions between the side casing unit 31 and the rear casing unit 33 and/or on boundary regions between the side casing unit 31 and additional casing parts. In some embodiments, an alternative form of the membrane unit 43 may be used (e.g., a cylindrical form and/or a sheet-type form). The form of the membrane unit 43 may be tailored to the boundary region.

While the present invention has been described above by reference to various embodiments, it should be understood that many changes and modifications may be made to the described embodiments. It is therefore intended that the foregoing description be regarded as illustrative rather than limiting, and that it be understood that all equivalents and/or combinations of embodiments are intended to be included in this description.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding claim—whether independent or dependent—and that such new combinations are to be understood as forming a part of the present specification.

The invention claimed is:

1. A magnetic resonance apparatus, comprising:
    a magnet unit comprising a high-frequency antenna unit; and
    a housing casing unit enclosing the magnet unit;
        wherein the housing casing unit comprises a side casing unit, a front casing unit, a rear casing unit, and at least one membrane unit;
        wherein one or more of the side casing unit, the front casing unit, and the rear casing unit comprises at least one casing part;
        wherein at least one boundary region of the housing casing unit is disposed between different casing parts;
        wherein the at least one membrane unit comprises a barrier for one or both of propagation and transmission of sound waves and covers at least one boundary region between two casing parts; and
        wherein a portion of the at least one membrane unit is spaced apart from at least one of the two casing parts.

2. The magnetic resonance apparatus of claim 1, wherein one or more of the side casing unit, the front casing unit, and the rear casing unit comprises the at least one membrane unit.

3. The magnetic resonance apparatus of claim 2 wherein the at least one membrane unit is disposed on boundary regions between one or more of the side casing unit, the front casing unit, and the rear casing unit.

4. The magnetic resonance apparatus of claim 1 wherein the at least one membrane unit is disposed on boundary regions between one or more of the side casing unit, the front casing unit, and the rear casing unit.

5. The magnetic resonance apparatus of claim 1, wherein the at least one membrane unit is disposed along one or both of a transmission path and a propagation path of the sound waves emitted from the magnet unit between the magnet unit and the at least one casing part.

6. The magnetic resonance apparatus of claim 1, wherein:
    one or both of the front casing unit and the rear casing unit comprises a tapering casing insertion unit;
    a first boundary region of the housing casing unit is disposed between a boundary surface of the tapering casing insertion unit of one or both of the front casing unit and the rear casing unit facing the high-frequency antenna unit, and a boundary surface of the high-frequency antenna unit facing the tapering casing insertion unit of one or both of the front casing unit and the rear casing unit; and
    the at least one membrane unit is disposed along one or both of a transmission path and a propagation path of the sound waves emitted from the magnet unit in front of the first boundary region.

7. The magnetic resonance apparatus of claim 6 wherein the at least one membrane unit of one or both of the front casing unit and the rear casing unit is disposed along one or both of a transmission path and a propagation path of the sound waves emitted from the magnet unit in front of the first boundary region and in front of the second boundary region.

8. The magnetic resonance apparatus of claim 1 wherein:
    one or both of the front casing unit and the rear casing unit comprises a tapering casing insertion unit and at least one further casing part;
    a second boundary region is disposed between a boundary surface of the tapering casing insertion unit facing the further casing part and a boundary surface of the further casing part facing the tapering casing insertion unit on one or both of the front casing unit and the rear casing unit; and the at least one membrane unit is disposed along one or both of a transmission path and a propagation path of the sound waves emitted from the magnet unit in front of the second boundary region.

9. The magnetic resonance apparatus of claim 8 wherein the at least one membrane unit of one or both of the front casing unit and the rear casing unit is disposed along a transmission path, a propagation path, or a transmission path and a propagation path of the sound waves emitted from the magnet unit in front of the first boundary region and in front of the second boundary region.

10. The magnetic resonance apparatus of claim 1 wherein at least a portion of the membrane unit comprises a truncated cone form.

11. The magnetic resonance apparatus of claim 1 wherein the housing casing unit comprises at least one fastening unit, and the at least one membrane unit is disposed on one or both of the high-frequency antenna unit and the at least one casing part by the at least one fastening unit.

12. The magnetic resonance apparatus of claim 11, wherein the fastening unit comprises at least one fastening element, wherein the at least one fastening element is disposed along a radial direction on an outer face of the high-frequency antenna unit, and wherein the at least one fastening element is configured to fasten the at least one membrane unit to the high-frequency antenna unit.

13. The magnetic resonance apparatus of claim 12, wherein the at least one fastening element is disposed on a face of the casing part of one or both of the front casing unit and the rear casing unit facing the magnet unit.

14. The magnetic resonance apparatus of claim 12 wherein the at least one fastening element comprises a form-fit element.

15. The magnetic resonance apparatus of claim 11 wherein the at least one fastening unit comprises at least one fastening element, wherein the at least one fastening element is disposed on an outer face of the casing part of one or both of the front casing unit and the rear casing unit facing away from the magnet unit.

16. The magnetic resonance apparatus of claim 15, wherein the at least one fastening element is disposed on a face of the casing part of one or both of the front casing unit and the rear casing unit facing the magnet unit.

17. The magnetic resonance apparatus of claim 15 wherein the at least one fastening element comprises a form-fit element.

18. The magnetic resonance apparatus of claim 11, wherein the fastening unit comprises at least one fastening element, and wherein the at least one fastening element is disposed on a face of the casing part of one or both of the front casing unit and the rear casing unit facing the magnet unit.

19. The magnetic resonance apparatus of claim 11 wherein the at least one fastening element comprises a form-fit element.

20. The magnetic resonance apparatus of claim 19, wherein the form-fit element comprises a clamping element.

21. A magnetic resonance apparatus of claim 1, wherein the at least one membrane unit covers at least one boundary region between three or more casing parts.

22. A magnetic resonance apparatus, comprising:
a magnet unit comprising a high-frequency antenna unit; and
a housing casing unit enclosing the magnet unit;
wherein the housing casing unit comprises a side casing unit, a front casing unit, a rear casing unit, at least one membrane unit, and at least one fastening unit;
wherein one or more of the side casing unit, the front casing unit, and the rear casing unit comprises at least one casing part;
wherein at least one boundary region of the housing casing unit is disposed between different casing parts;
wherein the at least one membrane unit is disposed on one or both of the high-frequency antenna unit and the at least one casing part by the at least one fastening unit; and
wherein the at least one membrane unit comprises a barrier for one or both of propagation and transmission of sound waves and covers at least one boundary region between two casing parts.

* * * * *